(12) United States Patent
Lee et al.

(10) Patent No.: US 7,849,881 B2
(45) Date of Patent: Dec. 14, 2010

(54) CIRCUIT BOARD FOR A SOLENOID VALVE MANIFOLD

(75) Inventors: Jin Young Lee, Chuncheon (KR); Gang Woon Heo, Incheon (KR); Young Min Yun, Incheon (KR); Bong Young Lee, Incheon (KR)

(73) Assignee: TPC Mechatronics Corp. (KR)

( * ) Notice: Subject to any disclaimer, the term of this patent is extended or adjusted under 35 U.S.C. 154(b) by 307 days.

(21) Appl. No.: 12/223,736

(22) PCT Filed: Aug. 4, 2006

(86) PCT No.: PCT/KR2006/003061

§ 371 (c)(1),
(2), (4) Date: Aug. 7, 2008

(87) PCT Pub. No.: WO2007/102643

PCT Pub. Date: Sep. 13, 2007

(65) Prior Publication Data

US 2009/0045367 A1 Feb. 19, 2009

(30) Foreign Application Priority Data

Mar. 9, 2006 (KR) .................. 10-2006-0022313

(51) Int. Cl.
*F16K 31/02* (2006.01)
(52) U.S. Cl. .................. 137/884; 251/129.15
(58) Field of Classification Search .......... 137/884, 137/271; 251/129.15
See application file for complete search history.

(56) References Cited

U.S. PATENT DOCUMENTS

| | | | |
|---|---|---|---|
| 5,234,033 A | 8/1993 | Stoll et al. | |
| 6,086,043 A * | 7/2000 | Hoffelder | 137/884 |
| 6,095,489 A * | 8/2000 | Kaneko et al. | 251/129.15 |
| 6,102,068 A * | 8/2000 | Higdon et al. | 137/884 |
| 7,377,481 B2 * | 5/2008 | Narita et al. | 251/129.15 |

FOREIGN PATENT DOCUMENTS

| | | |
|---|---|---|
| DE | 197 06 636 A1 | 8/1998 |
| EP | 1 043 527 A1 | 10/2000 |
| EP | 1 070 892 B1 | 2/2005 |
| JP | 2000-283313 A | 10/2000 |
| JP | 2000-283323 A | 10/2000 |
| JP | 2004-100790 A | 4/2004 |
| KR | 10 2000-0063058 A | 10/2000 |

* cited by examiner

*Primary Examiner*—Kevin L Lee
(74) *Attorney, Agent, or Firm*—Harness, Dickey & Pierce, P.L.C.

(57) ABSTRACT

A circuit board (205) for a valve block (120) of a solenoid valve manifold is described. Each valve block (120) contains a valve which is actuated by either one single solenoid or by two solenoids. Both sides (210, 220) of the circuit board (210) are provided with a circuit (212, 222). The first surface (210) of the circuit board (205) carries a single type valve circuit (212) for supplying one single solenoid with electrical energy. This first surface (210) can be mark e.g. with an "S". The second surface (220) of the circuit board (205) carries a double-type valve circuit (222) for supplying two solenoids with electrical power. This second surface (220) can be marked e.g. with a "D". The circuit board (205) is positioned in the respective valve block (120) with the first surface (210) or the second surface (220) facing upwards depending on whether a single- or a double-solenoid-valve is used in the respective valve block (120).

6 Claims, 8 Drawing Sheets

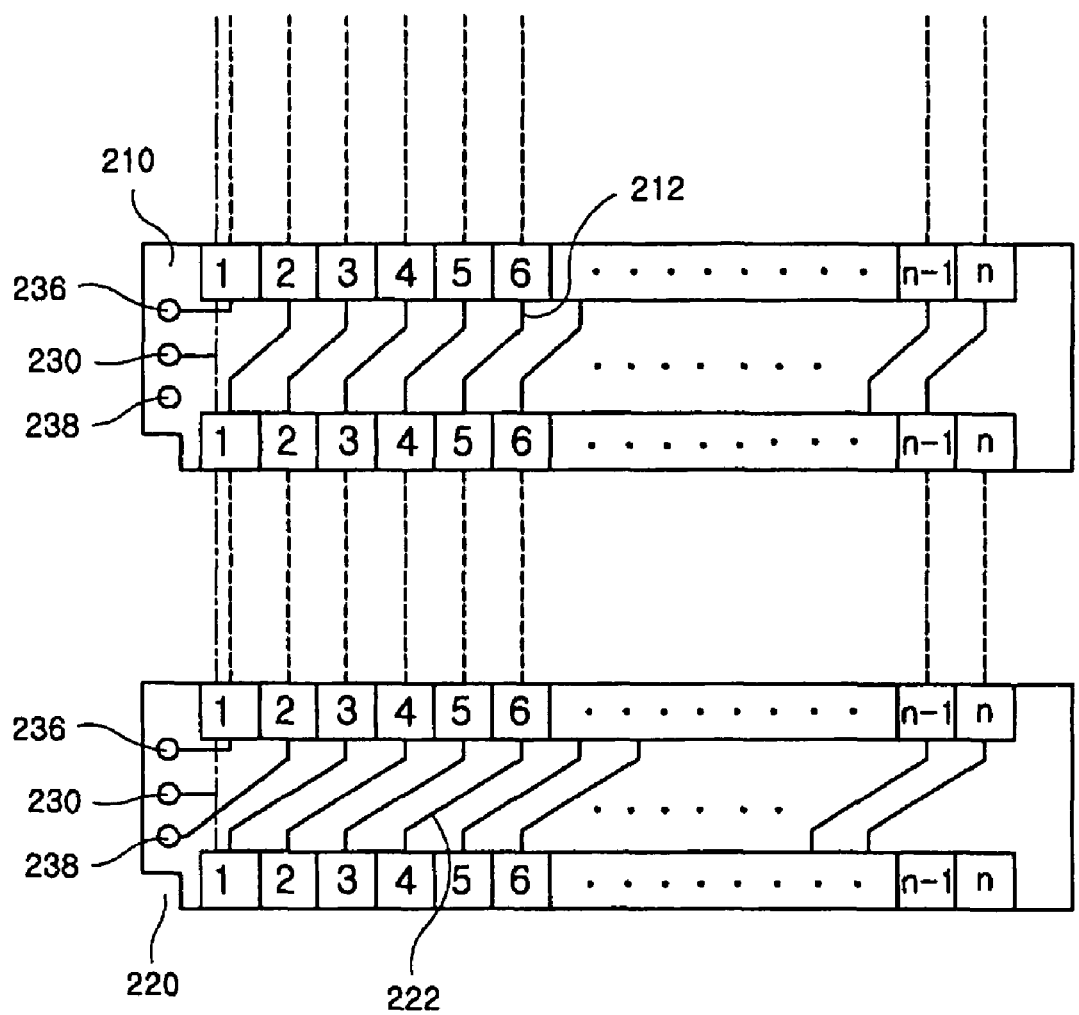
[Fig. 7]

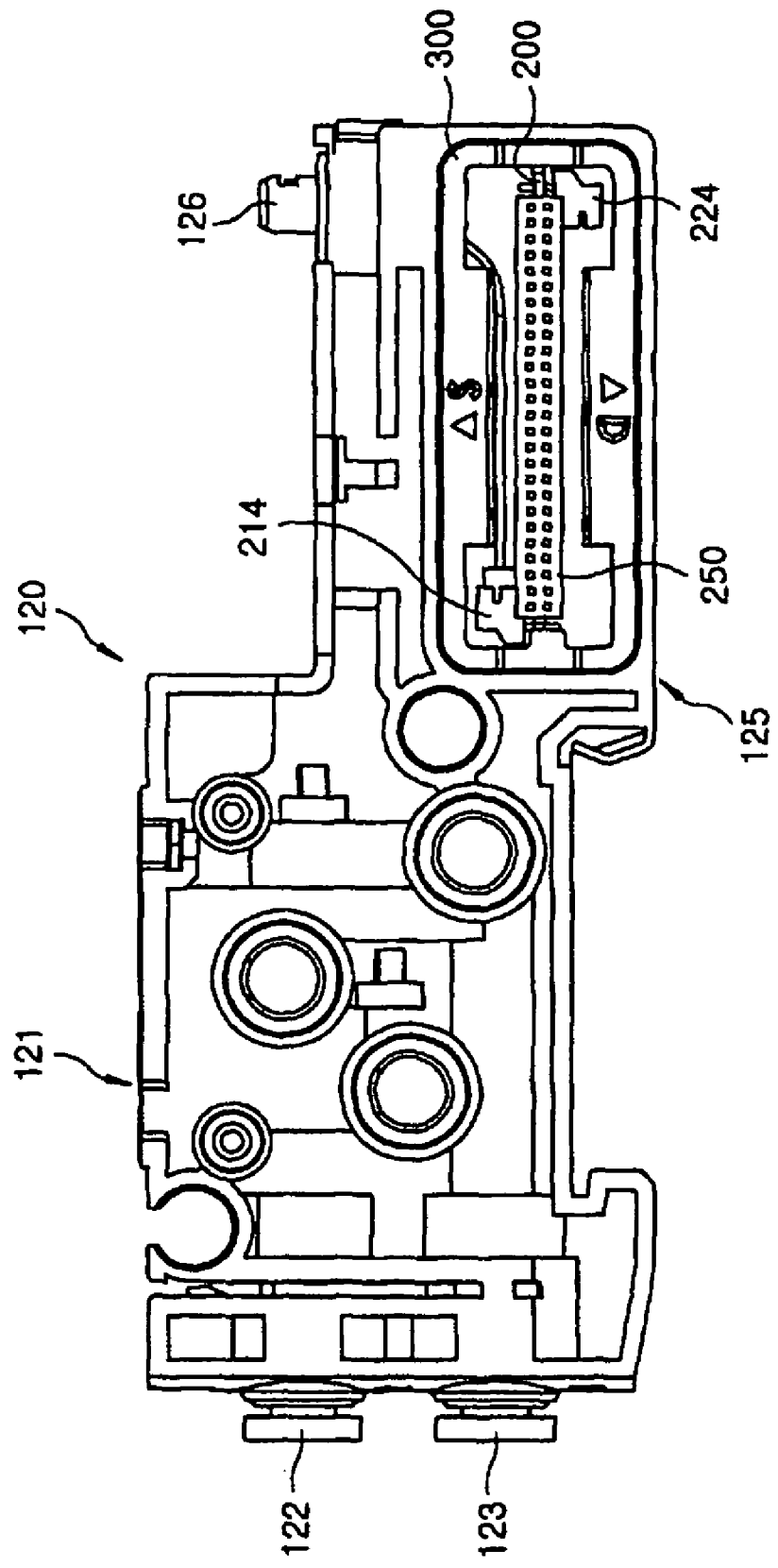
[Fig. 8]

CIRCUIT BOARD FOR A SOLENOID VALVE MANIFOLD

TECHNICAL FIELD

The present invention relates to a manifold-type valve assembly; and, more particularly, to a manifold-type valve assembly capable of switching between a single solenoid valve and a double solenoid valve mounted on a manifold block through a simple switching operation.

BACKGROUND ART

In a manufacturing process for a semiconductor device, a certain gas (hydrogen, oxygen, nitrogen, and so forth) is supplied into a gas cabinet apparatus to create a specific condition for washing, cleaning, and the like. At this time, a manifold-type valve is used to control a small-size single-acting gas cylinder.

In a fluid control system employing a plurality of solenoid-actuated valves using air pressure, hydraulic pressure, and so forth, wiring between each solenoid-actuated valve and a driving apparatus or a controller is very complicated. Accordingly, to simplify wiring and reduce an attachment space, a manifold-type valve assembly having a solenoid-actuated valve installed on a base of a manifold has been employed. For example, one of manifold-type valve assemblies is disclosed in a Japanese Laid-open Patent Application No. 2004-100790.

Such a conventional manifold-type valve assembly has: one or more solenoid-actuated valves as necessary; manifold blocks for mounting thereon the solenoid valves individually while connecting them to each other; and an air supply/exhaust block for supplying or exhausting compressed air through the insides of the manifold blocks. In general, the solenoid-actuated valves installed on the manifold blocks include a single solenoid-actuated valve (hereinafter, simply referred to as a single-type valve) for performing a switching of a flow path of a main valve by means of a single solenoid; and a double solenoid-actuated valve (hereinafter, simply referred to as a double-type valve) for performing a switching of the flow path of the main valve by means of two solenoids.

As for such a manifold-type valve assembly, though it is possible to drive each of the solenoid-actuated valves mounted on the manifold blocks by using a common control signal, the number, i.e., one or two, of solenoids is varied depending on whether a solenoid-actuated valve is a single-type valve or a double-type valve and, thus, it is required to adjust a circuit configuration to be suitable for either one of them. Further, given that one of the solenoid-actuated valves individually mounted on the manifold blocks can be replaced by a double-type valve from a single-type valve or vice versa, it is preferable to switch the circuit configuration for controlling the solenoid-actuated valves in a simple manner. In general, a control scheme for controlling a solenoid-actuated valve by providing an electrical power to the solenoid-actuated valve is installed in a signal board inside a manifold block. In such a case, depending on whether the solenoid-actuated valve installed on a certain manifold block is a single-type valve or a double-type valve, the controlling type of the control scheme is predetermined and the predetermined control scheme is accommodated in the manifold block. Therefore, when a certain solenoid-actuated valve mounted on the manifold block is alternated between a single-type valve and a double-type valve, not only the solenoid-actuated valve assembly needs to be changed but also a control scheme disposed in its manifold block should be changed by dismantling the manifold block, which is very troublesome.

DISCLOSURE OF INVENTION

Technical Problem

It is, therefore, an object of the present invention to provide a manifold-type valve assembly capable of switching between a single-type valve and a double-type valve in a simple manner.

Technical Solution

In accordance with the present invention, there is provided a manifold-type valve assembly capable of being changed-over between a single-type valve and a double-type valve, including comprising: one solenoid-actuated valve or two solenoid-actuated valves to constitute the single-type valve or the double-type valve, the single-type valve and the double-type valve being actuated by one and two solenoids, respectively; and, manifold blocks for accommodating the solenoid-actuated valves thereon individually, while connecting the solenoid-actuated valves to other ones mounted on neighboring manifold blocks, each manifold block having a power supply apparatus, wherein the power supply apparatus includes: a power supply terminal, for providing an electrical power to drive the solenoid-actuated valves of the single-type valve and the double-type valve; a circuit board connected to the power supply terminal and having a first surface and a second surface, the first surface having a single-type valve circuit for the single-type valve and the second surface having a double-type valve circuit for the double-type valve; and a male connector and a female connector installed at opposite sides of the circuit board and connected to their neighboring female and male connectors in neighboring manifold blocks, respectively, wherein each of the single- and the double-type valve circuits has valve contacts arranged in two rows, the valve contacts in a first row being connected to the valve contacts in a second row with offset by the number of solenoids and, for each valve circuit, the offset contact in the second row being connected to the power supply terminal; and wherein each of the male connector and the female connector has connector contacts corresponding to the valve contacts in each valve circuit.

Advantageous Effects

As described above, as for the power supply apparatus for a manifold-type valve assembly in accordance with the present invention, the driving control of a single-type valve and a double-type valve employed in the manifold-type valve assembly is possible by means of a circuit board with a single-type valve and a double-type valve in its surfaces. Thus, even when one of solenoid-actuated valves installed on the manifold block is changed between a single-type valve and a double-type valve, the changing-over the circuit board can be carried out simply by changing the connection directions of the circuit board and connectors. Therefore, the assembly of solenoid-actuated valves and replacement thereof can be facilitated.

BRIEF DESCRIPTION OF THE DRAWINGS

The above and other objects and features of the present invention will become apparent from the following description of preferred embodiments given in conjunction with the accompanying drawings, in which:

FIG. 7 is an electrical connection between the single and the double-type valve circuits shown in FIGS. 5 and 6; and FIG. 8 illustrates a state of using the power supply apparatus for the manifold block in accordance with the present invention.

BEST MODE FOR CARRYING OUT THE INVENTION

Hereinafter, preferred embodiments of the present invention will be described in detail with reference to the accompanying drawings.

Figure 1:
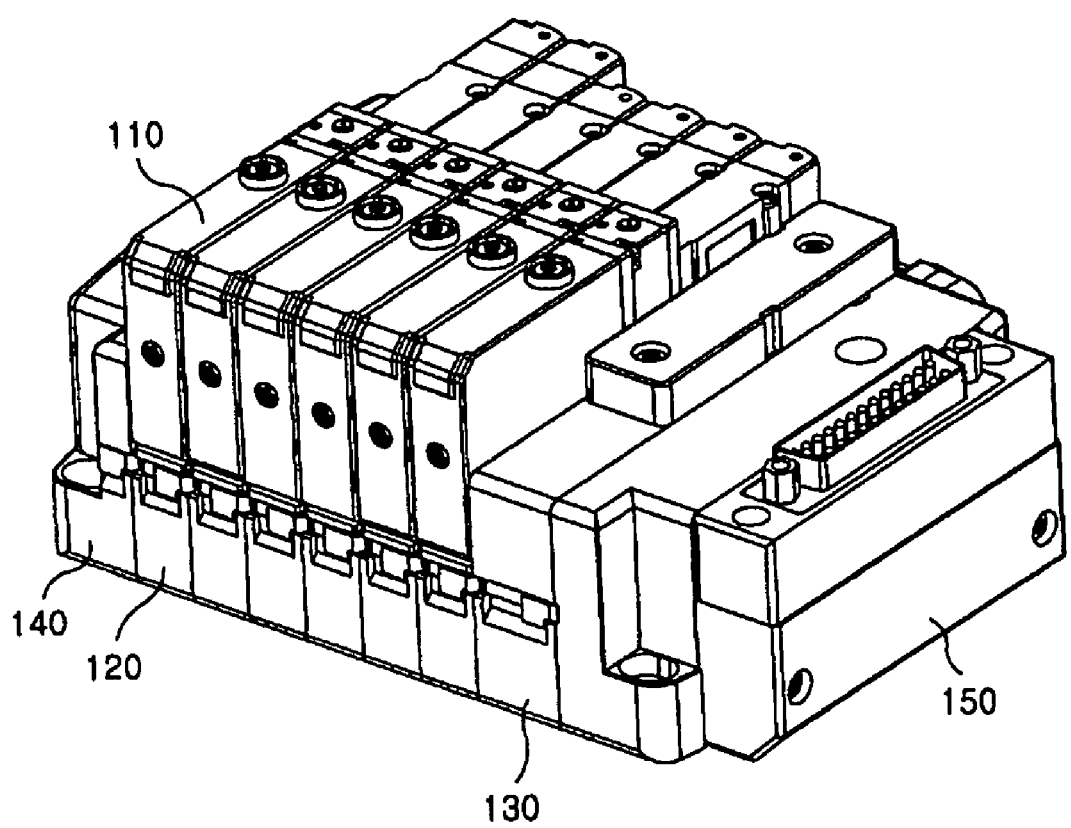
FIG. 1 is a perspective view of a manifold-type valve assembly in accordance with the present invention.

Referring to FIG. 1, there is provided a perspective view showing a manifold-type valve assembly in accordance with the present invention.

A manifold-type valve assembly shown in FIG. 1 includes: one or more solenoid-actuated valves 110 arranged in parallel to each other, each solenoid-actuated valve 110 being a single-type valve or a double-type valve; manifold blocks (or base blocks) 120 for accommodating the solenoid-actuated valves 110 thereon individually, while connecting the solenoid-actuated valves 110 to each other; an air supply/exhaust block 130 disposed at one of two opposite ends of the assembly of the manifold blocks 120, for supplying/exhausting compressed air through the insides of the manifold blocks 120; an end block 140 disposed at the other end of the assembly of the manifold blocks 120; and a relay unit 150 attached to the air supply/exhaust block 130, for relaying a control signal to each solenoid-actuated valve 110.

Figure 2:
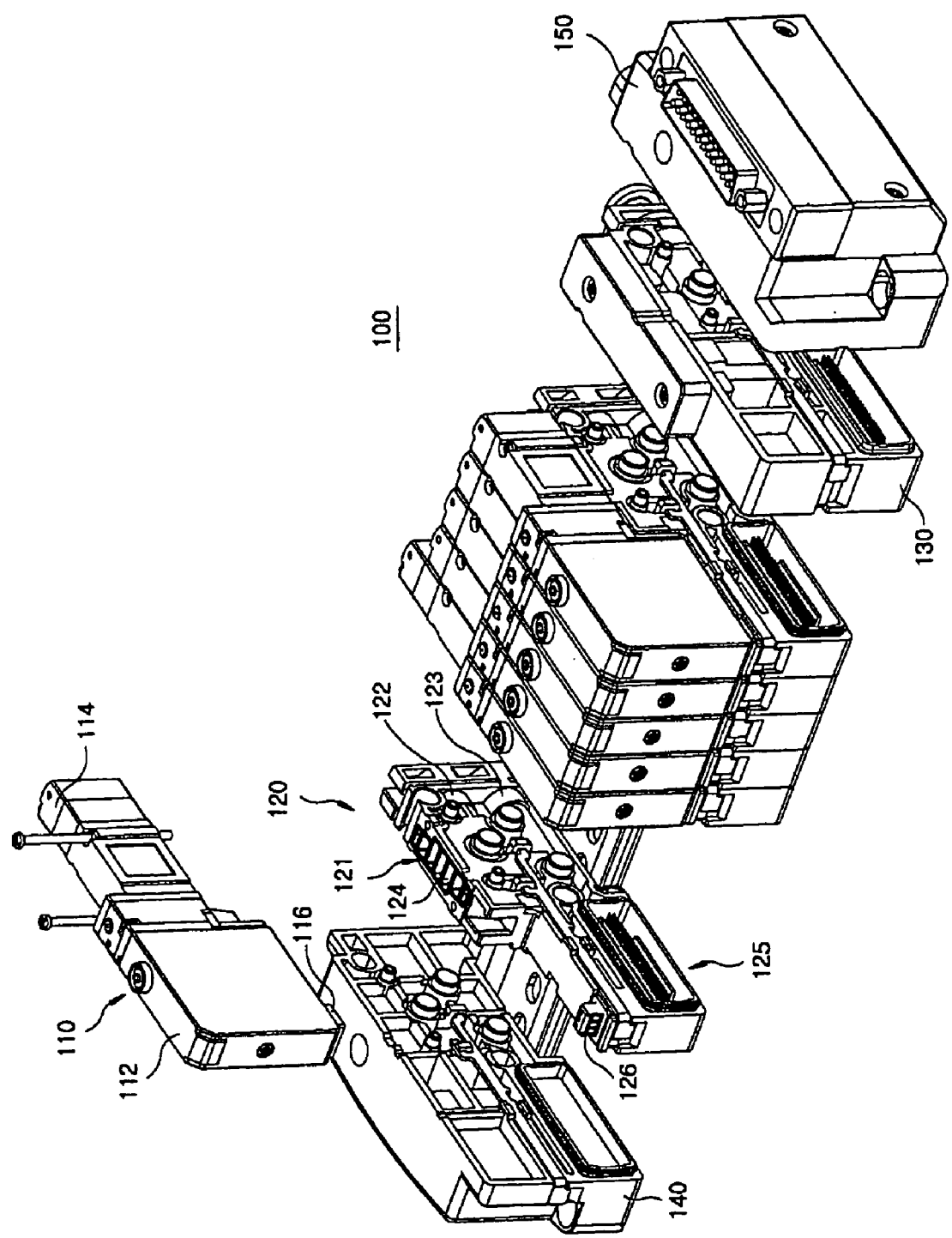
FIG. 2 sets forth an exploded perspective view of the manifold-type valve assembly shown in FIG. 1.
Figure 3:
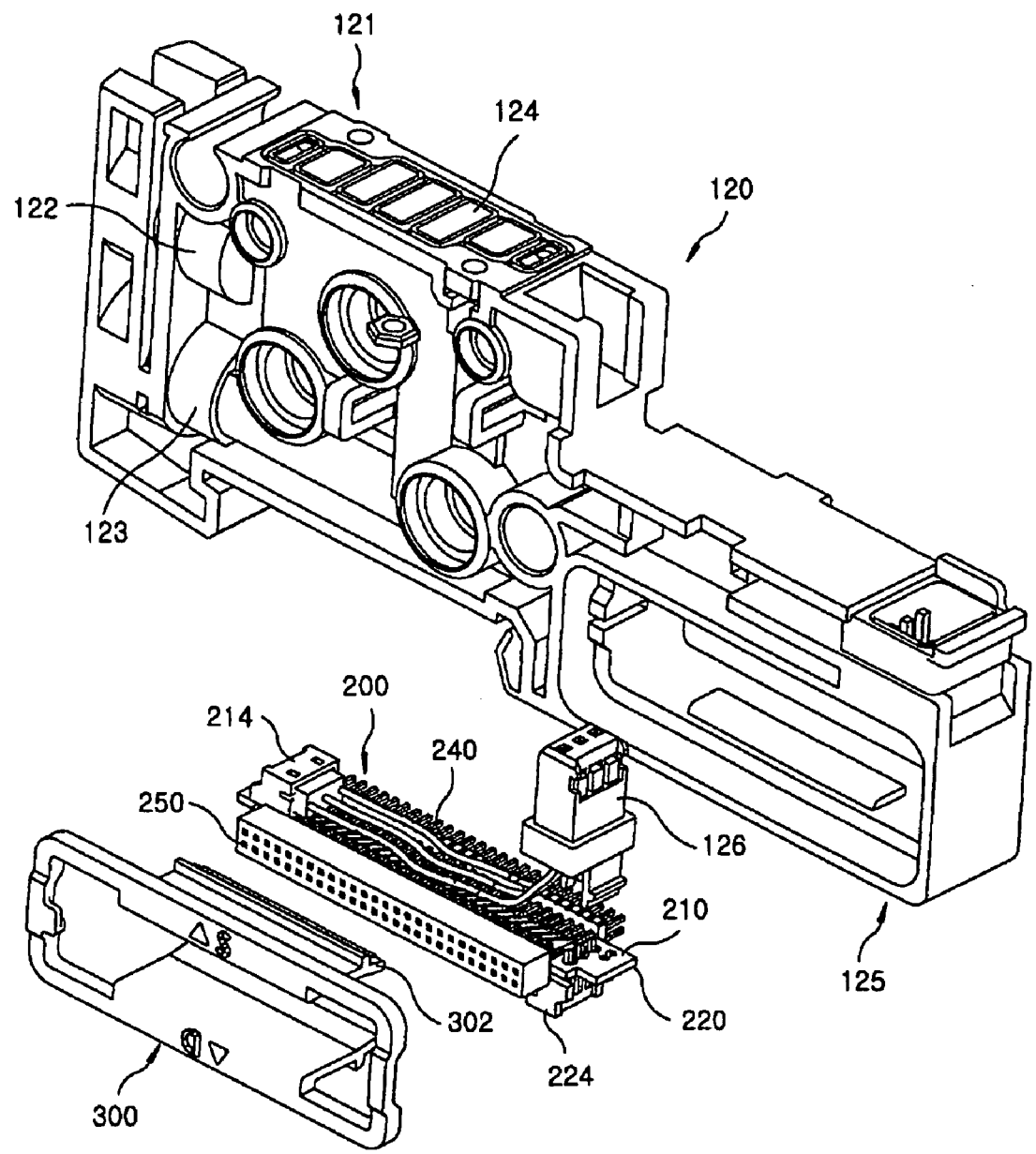
FIG. 3 presents an exploded perspective view of a manifold block shown in FIG. 2.

FIG. 2 sets forth an exploded perspective view of the manifold-type valve assembly in accordance with the present invention, and FIG. 3 is an exploded perspective view of a manifold block shown in FIG. 2.

As shown in FIGS. 2 and 3, each solenoid-actuated valve 110 is fixed on a manifold block 120 via screws or the like. Each solenoid-actuated valve 110 has therein one or two solenoid valves (not shown) to control a single-type valve or a double-type valve. As for the operation of such a solenoid-actuated valve 110, an air supply and an air exhaust of a main valve 114 are switched by pilot air passing through a small-size pilot valve 112 which is electronically driven by a solenoid or solenoids.

Further, the solenoid-actuated valve 110 has a power receiving terminal 116 installed at a lower side thereof. The power receiving terminal 116 is facing downward to form an electrical connection with a power supply terminal 126 on the manifold block 120 in case where the solenoid-actuated valve 110 is mounted on the manifold block 120.

Here, though the solenoid-actuated valve 110 is comprised of a single-type valve or a double-type valve, same manifold block 120 is used for both of the single-type valve and the double-type valve, providing the same external appearances. However, depending on whether it is a single-type valve or a double-type valve, the solenoid-actuated valve 110 has a different internal circuit configuration.

Referring to FIG. 3, each manifold block 120 has a fluid flow path portion 121 having a flow path communicated with a flow path inside the air supply/exhaust block 130; and an opened inner portion 125. A pair of output openings 122 and 123 is installed at one side of the manifold block 120 of the fluid flow path portion 121. The output openings 122 and 123 serve as a main fluid flow path for discharging fluids from the solenoid-actuated valve 110. Moreover, the output openings 122 and 123 are communicated with a surface of a fluid opening 124. Further, a power supply apparatus 20 for controlling a single-type valve or a double-type valve is also installed in the opened inner portion 125.

Figure 4:
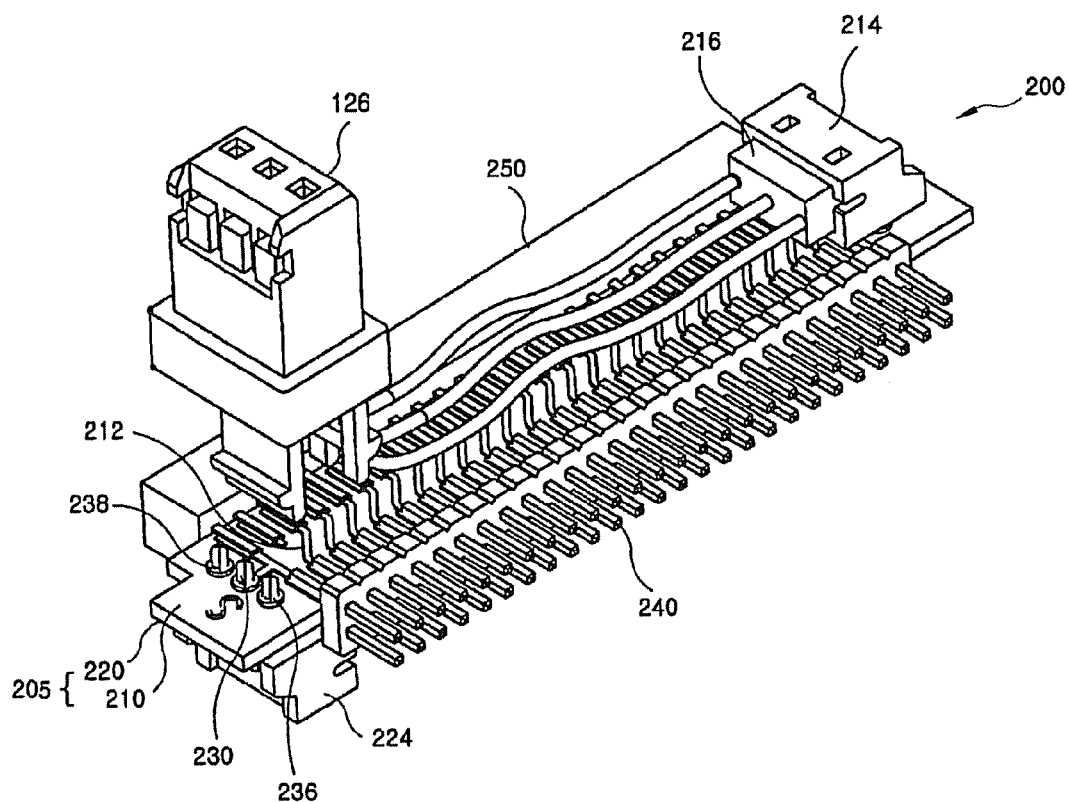
FIG. 4 shows a perspective view of a power supply apparatus in a manifold block shown in FIG. 2.

FIG. 4 is a perspective view of the power supply apparatus 200 shown in FIG. 3.

The power supply apparatus 200 includes a circuit board 205, power supply connectors 214 and 224, and a power supply terminal 126.

Installed on the top surface of the opened inner portion 125 is the power supply terminal 126 through which the electrical power is provided to the power receiving terminal 116 of the solenoid-actuated valve 110.

The circuit board 205 has a first surface 210 and a second surface 220, which is a backside of the first surface 210. Formed on the first surface 210 of the circuit board 205 is a single-type valve circuit 212 for controlling a single-type valve. Also, the power supply connector 214 is formed on the first surface 210, facing upward, and is electrically connected with the power supply terminal 126 through a cable connector 216. The cable connector 216 is detachable to and from the power supply connector 214.

On the other hand, formed on the second surface 220 is a double-type valve circuit 222 for controlling double-type valves. Also, the power supply connector 224 is formed on the second surface 220, facing upward when upsetting the circuit board 205 reversely, and is electrically connected to the power supply terminal 126 with the cable connector 216. Preferably, to help a user distinguish the single-type value and the double-type value readily, a character, e.g., an alphabet "S" is inscribed on the first surface 210, while an alphabet "D" is inscribed on the second surface 220 (See FIGS. 5 and 6).

Figure 5:
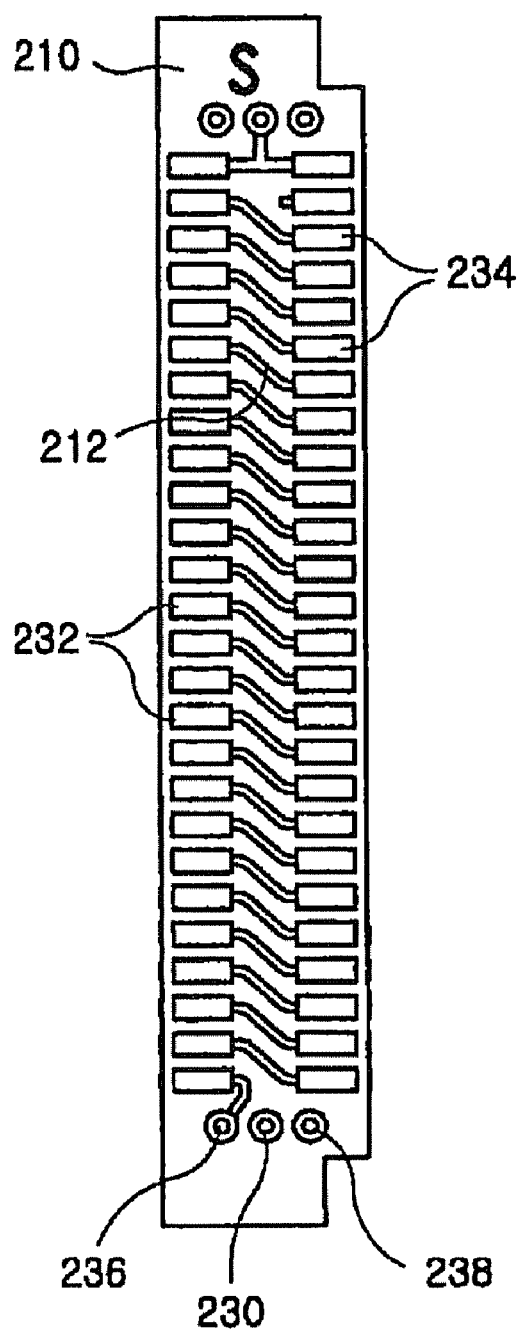
FIGS. 5 and 6 depict diagrams illustrating a single-type valve circuit and a double-type valve circuit of the circuit board shown in FIG. 4, respectively.
Figure 6:
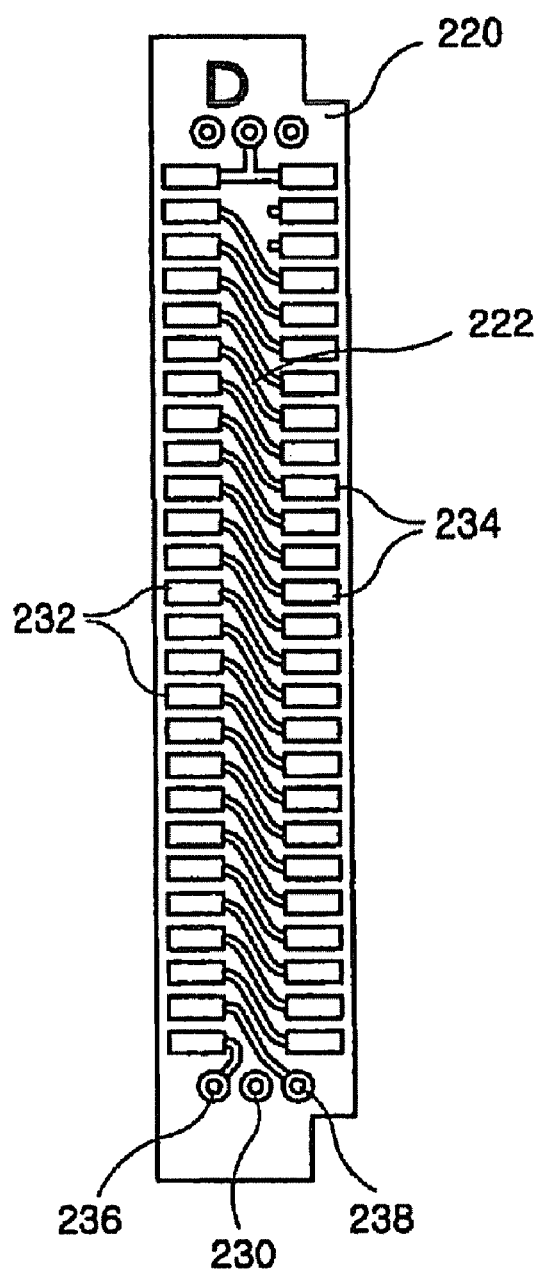

FIGS. 5 and 6 are schematic diagrams illustrating a single-type valve circuit and a double-type valve circuit of the circuit board, respectively, and FIG. 7 is an electrical connection of the single-type valve circuit and the double-type valve circuit shown in FIGS. 5 and 6.

As shown in FIGS. 5 and 6, the single-type valve circuit 212 on the first surface 110 has contacts 232 and 234 arranged at edges of the circuit board 205 in two rows; and the double-type valve circuit 222 on the second surface 220 has also contacts 232 and 234 arranged at edges of the circuit board 220 in two rows.

As for each valve circuit, as shown in FIG. 7, the valve contacts 232 in a first row are connected to their corresponding valve contacts 234 in a second row in one-to-one correspondence in a manner that a (n+1)th or a (n+2)th (where n is a number of the contacts to the solenoid-actuated valves) contact in the first row is connected to a nth value contact in the second row depending on the number of solenoids. That is, in case of a single-type valve, a (n+1)th valve contact in the first row is connected to a nth valve contact in the second row; and in case of a double-type valve, (n+1)th and (n+2)th value contacts in the first row is connected to a nth and (n+1)th value contacts in the first row.

In other words, in a single- or double-type valve circuit, the contacts 232 in a first row are connected to the contacts 232 in a second row while being offset by the number of solenoids. The circuit board 205 further includes a common contact 230 and common power contacts 236 and 238 that are formed of through holes covered with a conductive material. The common contact 230 is used as a reference voltage, while the power contacts 236 and 238 are connected to the power supply terminal 126. In case of the single-type valve circuit 212, only the common power contact 236 is devoted to the offset contact having the number '1'. And, in case of the double-type valve circuit 222, both the common power contacts 236 and 238 are devoted to the offset contacts having the numbers '1' and '2'.

Referring back to FIGS. 3 and 4, the power supply apparatus 200 further includes a male connector 240 and a female connector 250 that are disposed in opposite sides of the circuit board 205. The male connector 240 and the female connector 250 have a plurality of contacts that are correspondingly coupled to the contacts 232 and 234 in the rows of the circuit board 205, respectively.

The male connector 240 and the female connector 250 are connected to their neighboring female connector and male connector in neighboring manifold blocks, respectively. Accordingly, the neighboring circuit boards 205 are electrically connected to each other, via the male connector 240 and the female connector 250, enabling relay of the control signal to the neighboring circuit boards.

Preferably, such a circuit board 205 is installed inside a manifold block 120 via a holder member 300 (see FIG. 3).

The holder member 300 is made of a synthetic resin material having relatively elasticity, and it has a substantially rectangular shape and has therein a hollow space for accommodating the circuit board 205. Preferably, a mark for indicating the state of a single-type valve or a double-type valve is provided on the front surface of the holder member 300. For example, by inscribing an alphabet "S" or "D" at an upper or a lower portion of the front surface of the holder member 300, the assembled state of the circuit board 205 can be identified. The holder member 300 has a structure capable of being assembled with the circuit board 205 only when its installation direction coincides with the installation direction of the circuit board 205, i.e., only when the relative positions of the "S" and "D" inscriptions thereon coincide with those of the "S" and "D" inscriptions on the circuit board 205.

Also, a hook portion 302 (see FIG. 3) to be inserted into and locked with the manifold block 120 is protrudently formed on the rear surface of the holder member 300.

Meanwhile, a plurality of manifold blocks 120 are arranged while being connected to each other. The air supply/exhaust block 130 for supplying and exhausting compressed air into and out of the connected insides of the manifold blocks 120 is installed at one of two ends of such an assembly of the connected manifold blocks 130, and the end block 140 is installed at the other end of the assembly of the manifold blocks 130.

Hereinafter, an operation of a power supply apparatus for a manifold-type valve assembly will be explained with reference to FIG. 8.

First, control signal is produced from a controller (not shown), and the control signal is transmitted to the relay unit 150.

Then, the control signal is provided through the relay unit 150 to the circuit boards 200 loaded in the manifold blocks 120 step-by-step.

In each circuit board 205 where an operation is made to supply electrical power to the solenoid-actuated valve 110 mounted on a corresponding manifold block 120 or to cut the power supply thereto, the control signal is transmitted to the solenoid-actuated valve 110 from the power supply terminal 126 via the power receiving terminal 116 of the solenoid-actuated valve 110. Further, the control signal is sent in sequence to a next circuit board 205 for controlling an operation of a next solenoid-actuated valve 110 via the male connector 240 and the female connector 250.

Meanwhile, a circuit connection within the circuit board 205 is varied depending on whether the solenoid-actuated valve 110 controlled thereby is a single-type valve or a double-type valve.

In case the solenoid-actuated valve 110 is a single-type valve, the circuit board 205 is placed with its first surface 210 facing upward and is installed such that the "S" inscription on the holder member 300 is indicated on the upper position. During placement of the first surface 210, the power supply connector 214 on the first surface 210 is connected to the power supply terminal 126 through the use of the cable connector 216.

In contrast, if a solenoid-actuated valve 110 mounted on manifold block 120 is a double-type valve, the circuit board 205 is placed with its second surface 220 facing upward and is installed such that the "D" inscription on the holder member 300 is located at an upper position than the "S" inscription. During placement of the second surface 220, the power supply connector 224 on the second surface 220 is connected to the power supply terminal 126 with the cable connector 216.

Thereafter, the holder member 300 is fitted and fixed to the opened inner portion 125 of the manifold block 120 by locking the hook portion 302 with the manifold block 120.

In case the solenoid-actuated valve 110 is a single-type valve, the assembly method is the same as described above; so description thereof will be omitted.

Therefore, when a circuit board 205 for the driving control of an solenoid-actuated valve is installed in an opened inner portion 125 of each manifold block 120, the circuit board 205 can be changed-over between a single-type valve and a double-type valve in a simple manner. Therefore, in a manifold-type valve assembly, even when one of solenoid-actuated valves 110 mounted on manifold blocks 120 is changed into a single or a double-type valve, a circuit board 205 therefor can be easily switched as well.

While the invention has been shown and described with respect to the preferred embodiments, it will be understood by those skilled in the art that various changes and modifications may be made without departing from the spirit and scope of the invention as defined in the following claims.

The invention claimed is:

1. A manifold-type valve assembly capable of being changed-over between a single-type valve and a double-type valve, comprising:

one solenoid-actuated valve or two solenoid-actuated valves to constitute the single-type valve or the double-type valve, the single-type valve and the double-type valve being actuated by one and two solenoids, respectively; and manifold blocks for accommodating the solenoid-actuated valves thereon individually, while connecting the solenoid-actuated valves to other ones mounted on neighboring manifold blocks, each manifold block having a power supply apparatus, wherein the power supply apparatus includes:

a power supply terminal, for providing an electrical power to drive the solenoid-actuated valves of the single-type valve and the double-type valve;

a circuit board connected to the power supply terminal and having a first surface and a second surface, the first surface having a single-type valve circuit for the single-type valve and the second surface having a double-type valve circuit for the double-type valve; and a male connector and a female connector installed at opposite sides of the circuit board and connected to their neighboring female connector and male connector in neighboring manifold blocks, respectively, wherein each of the single- and the double-type valve circuit has valve contacts arranged in two rows, the valve contacts in a first row being connected to the valve contacts in a second row with offset by the number of solenoids and, for each valve circuit, the offset contact in the second row being connected to the power supply terminal; and wherein each of the male connector and the female connector has connector contacts corresponding to the valve contacts in each valve circuit.

2. The manifold-type valve assembly of claim 1, wherein the circuit board has an inscription for indicating a single- or a double-type valve provided on the first and the second surfaces.

3. The manifold-type valve assembly of claim 1, further comprising:

a holder member, fitted into the manifold block, for accommodating the circuit board therein so that the circuit board is installed inside the manifold block, wherein the holder block has a hook portion locked with the manifold block so that the holder member is fixed to the manifold block.

4. The manifold-type valve assembly of claim 3, wherein the holder member further has a mark, the mark being provided on the front surface of the holder member to indicate the state on the single-type valve or the double-type valve.

5. A power supply apparatus capable of changing-over between a single-type valve and a double-type valve accommodated on a manifold block for a manifold-type valve assembly, comprising:

a power supply terminal, installed in the manifold block, for providing an electrical power for driving the single-type valve and the double-type valve; and a circuit board connected to the power supply terminal and having a first surface and a second surface, the first surface having a single-type valve circuit for the single-type valve and the second surface having a double-type valve circuit for the double-type valve, wherein the circuit board is placed with the first or the second surface facing upward depending on the single-type valve or the double-type valve so that the single-type valve circuit or the double-type valve circuit is coupled to the power supply terminal, respectively.

6. The apparatus of claim 5, wherein the circuit board has an inscription for indicating a single- or a double-type valve provided on the first and the second surfaces.

* * * * *